(12) United States Patent
Tachibana

(10) Patent No.: US 7,520,647 B2
(45) Date of Patent: Apr. 21, 2009

(54) LIGHT SOURCE AND VEHICLE LAMP

(75) Inventor: Kaori Tachibana, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 161 days.

(21) Appl. No.: 11/759,482

(22) Filed: Jun. 7, 2007

(65) Prior Publication Data
US 2007/0285939 A1    Dec. 13, 2007

(30) Foreign Application Priority Data
Jun. 9, 2006    (JP)    ............ 2006-160672

(51) Int. Cl.
*F21V 7/00*    (2006.01)
(52) U.S. Cl. ............ 362/516; 362/509; 362/800; 257/98; 257/99; 257/100
(58) Field of Classification Search ............ 362/561, 362/509, 85–88
See application file for complete search history.

(56) References Cited
U.S. PATENT DOCUMENTS

| | | | |
|---|---|---|---|
| 6,855,958 B2 | 2/2005 | Sato et al. | |
| 2003/0160255 A1* | 8/2003 | Taninaka et al. | 257/88 |
| 2006/0197101 A1* | 9/2006 | Wu | 257/99 |
| 2007/0247847 A1* | 10/2007 | Villard | 362/249 |
| 2008/0303038 A1* | 12/2008 | Grotsch et al. | 257/88 |

FOREIGN PATENT DOCUMENTS

| JP | 2004140090 | 5/2004 |
|---|---|---|
| JP | 2005276805 | 10/2005 |

* cited by examiner

*Primary Examiner*—Ali Alavi
*Assistant Examiner*—Evan Dzierzynski
(74) *Attorney, Agent, or Firm*—Cermak Kenealy Vaidya & Nakajima LLP (57) ABSTRACT

The disclosed subject matter includes light sources that have a high luminous flux and a favorable bright distribution, and includes vehicle lamps that have both a favorable light distribution pattern and a capability of being miniaturized by using the LED light sources. The light source can include a base board, a reflector having a cavity with a slender rectangular opening, a plurality of semiconductor light emitting chips located in a line in the cavity, and an encapsulating resin in the cavity. At least one chip among the plurality of semiconductor light emitting chips can be located on a central bottom portion of the cavity. The cavity can have one slant angle in a direction of a short side that is smaller than another slant angle. The vehicle lamp can include the light source, a shield plate, an optical lens, and reflectors that are selected according to a kind and/or design of a vehicle lamp.

33 Claims, 7 Drawing Sheets

A : $\theta 1 = 22°$, $\theta 2 = 45°$
B : $\theta 1 = \theta 2 = 45°$

Fig.8

A : $\theta 1 = 22°$, $\theta 2 = 45°$
B : $\theta 1 = \theta 2 = 45°$

LIGHT SOURCE AND VEHICLE LAMP

This application claims the priority benefit under 35 U.S.C. §119 of Japanese Patent Application No. 2006-160672 filed on Jun. 9, 2006, which is hereby incorporated in its entirety by reference.

BACKGROUND

1. Field

The presently disclosed subject matter relates to a light source and a vehicle lamp, and more particularly to a light source device using a plurality of LED chips and to a vehicle lamp such as a headlight, auxiliary headlight, or other vehicle lamp using the light source device.

2. Description of the Related Art

Figure 13:
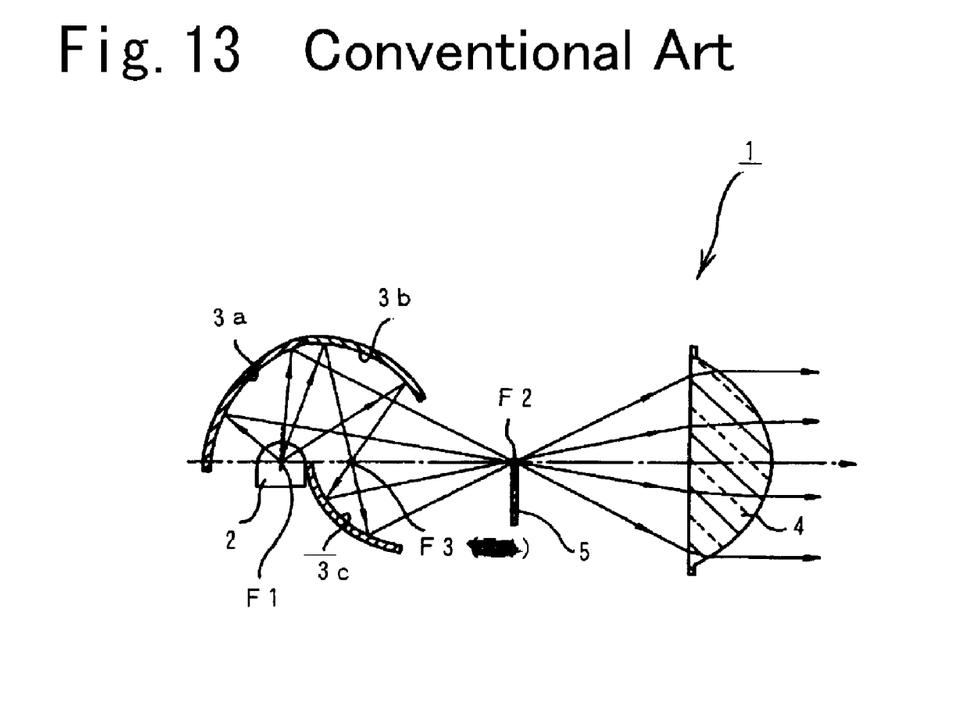
FIG. 13 is a schematic cross-section view showing a projector-typed structure for a conventional vehicle lamp.

A conventional vehicle lamp that uses a plurality of LED chips for a light source is disclosed in patent document No. 1 (Japanese Patent Application Laid Open JP2005-276805). FIG. 13 of the present application is a schematic cross-section view of a lamp disclosed in patent document 1. The conventional vehicle lamp 1 is a projector-type headlight that includes: an LED light source 2; a first reflector 3a; a second reflector 3b; a third reflector 3c; a projection lens 4; and a shield plate 5.

The first reflector 3a has an elliptic surface that has a first focus F1 located substantially at a central portion of the LED light source 2 so that a major axis thereof corresponds with a light axis in a direction towards the light-emitting direction of the LED light source 2. The elliptic surface has a second focus F2 located substantially at a rearward focus of the projection lens 4. The first reflector 3a reflects light emitted from the LED light source 2 in a direction towards the projection lens 4. The second reflector 3b is an elliptic surface that has a first focus F1 located substantially at the central portion of the LED light source 2 and a second focus F3 located substantially at a position more rearward than the second focus F2 of the first reflector 3a. The third reflector 3c is an elliptic surface that has a first focus located substantially at the second focus F3 of the second reflector 3b and a second focus located substantially at the second focus F2 of the first reflector 3a. The third reflector 3c can alternatively be configured as a parabolic surface that has a central axis corresponding with the above-described light axis.

The projection lens 4 is a convex lens that has a focus located at the second focus F2 of both the first reflector 3a and the third reflector 3c so as to focus the light emitted from the LED light source 2 and/or the light reflected by the first reflector 3a and the third reflector 3c. The shield plate 5 is located substantially at the focus of the projection lens 4 and in the way of the light paths from the LED light source 2 to the projection lens 4 in order to form a cutoff line.

In the vehicle lamp 1 as described above, a part of the light emitted from the LED light source 2 is reflects by the first reflector 3a, focuses at the second focus F2 of the first reflector 3a and emits forward via the projection lens 4. Other parts of the light emitted from the LED light source 2 is reflected by both the second reflector 3b and the third reflector 3c, focuses at the second focus F2 of the third reflector 3c and emits forward via the projection lens 4. Thus, the light emitted from the LED light source 2 forms a light distribution pattern according to the above-described operation and increases light-using efficiency.

Figure 14:
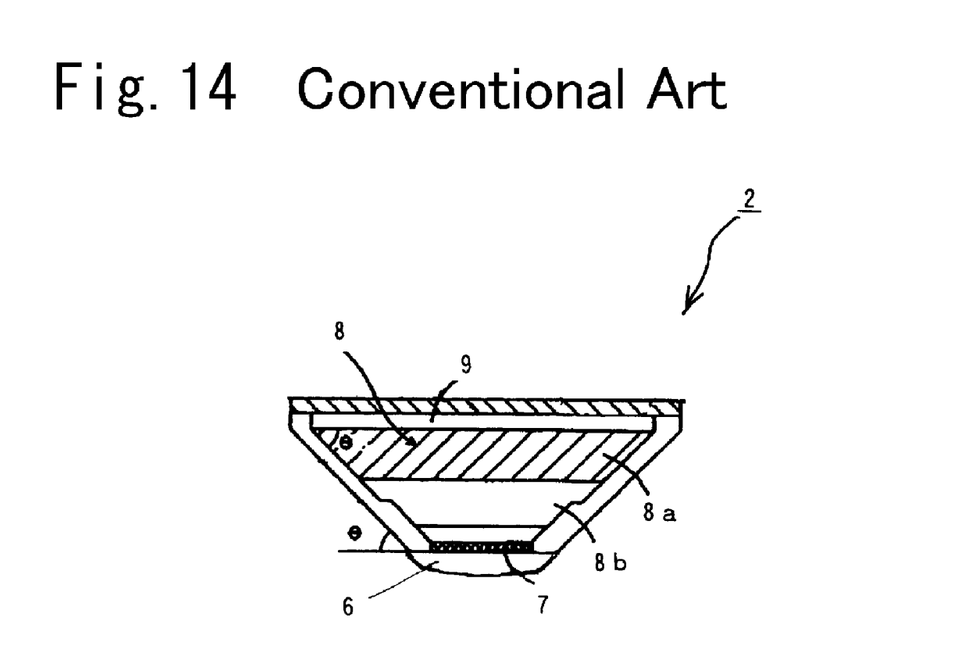
FIG. 14 is a schematic cross-section view showing a conventional LED light source for a vehicle lamp.

FIG. 14 shows a cross-sectional view of an LED light source 2 that is composed, for example, as disclosed in patent document No. 2 (Japanese Patent Application Laid Open JP2004-140090). The conventional LED light source 2 includes: a base 6 that includes a cavity thereon for reflecting light; electrodes 7 are exposed on a bottom surface of the cavity of the base 6; an LED chip 8 is disposed on the bottom surface of the cavity of the base 6, and is electrically connected to the electrodes 7; and, a wavelength conversion material 9.

The cavity in the base 6 is formed as a reflector and expands upward with a slant angle θ that is in the range of 0° to 90°. The LED chip 8 disposed in the cavity of the base 6 is a junction down typed LED, which includes a substrate 8a on a top portion thereof and a light-emitting portion 8b on a bottom portion thereof. Because the substrate 8a is made from a transparent material, light emitted from the light-emitting portion 8b passes through the substrate 8a. The light-emitting portion 8b includes electrodes adjacent thereto that are electrically connected to the electrodes 7. When a power supply introduces electrical current to the light-emitting portion 8b via the electrodes 7, the light emitted from the light-emitting portion 8b emits in a direction towards the substrate 8a directly and by reflecting on the electrodes 7.

The wavelength conversion material 9 is disposed as a layer so as to cover over the cavity of the base 6, and converts the light emitted from the light-emitting portion 8b. For example, a blue light of a blue LED chips is converted into a white light via a yellow/blue color mixture.

At least one side of the LED chip 8 is formed as a straight line to produce a light distribution characteristics of a vehicle lamp. An area of an opening of the cavity in the base 6 is formed smaller than double the area of the light-emitting area of the light-emitting portion 8b in order to increase a luminous flux diverging density of the light emitted upward from the wavelength conversion material 9. The luminous flux diverging density is a luminous flux per unit area that shows 1 m/m². Therefore, if the luminous flux is the same, the smaller the opening area, the more the luminous flux diverging density increases.

In the above-described LED light source 2, the light emitted from the LED chip 8 emits into the wavelength conversion material 9 both directly and by reflecting on both a side surface of the cavity base 6 and the electrodes 7. The light is then wavelength converted by the wavelength conversion material 9. The wavelength-converted light emits upward with a predetermined light distribution characteristic according to the opening shape of the cavity of the base 6.

1. Patent document No. 1: Japanese Patent Application Laid Open JP2005-276805
2. Patent document No. 2: Japanese Patent Application Laid Open JP2004-140090

In the LED light source 2 according to patent document No. 2, the luminous flux diverging density is high. When a road in front of a vehicle is lighted by an optical structure such as a projection-type headlight and/or a reflection-type headlight, the road located at both a far and a near distance are lighted with a same brightness by the light source with a high luminous flux diverging density. When a driver sees a road lighted by the above-described headlight, the driver recognizes brightness at a nearer portion of the road more than a far portion of it. Thus, because the human eye typically focuses according with the nearer brightness, the visibility for distance decreases.

In addition, when the opening area of the cavity in the base 6 become small, the luminous flux emitted from the opening out of the LED light source 2 decreases. Thus, the LED light source 2 is not favorable for a vehicle lamp due to requiring a high luminous flux.

A conventional light source such as a HID is typically located at a focus of a reflector, in which the focus distance is longer than 20 mm. Because the LED light source 2 is smaller than a HID, it is desirable for a vehicle lamp using the LED light source 2 to be miniaturized by locating the LED light source 2 within the focal distance range of 20 mm. However, such a vehicle lamp has problems such as a short focus distance resulting in a large light distribution pattern. Thus, it is difficult for the LED light source 2 to form a light distribution pattern that is in accordance with light distribution standards.

The disclosed subject matter has been devised to consider the above and other problems and characteristics. Thus, an embodiment of the disclosed subject matter can include LED light sources with a high luminous flux and a favorable brightness distribution, and can include vehicle lamps with a favorable light distribution pattern and which also use LEDs for a light source.

SUMMARY OF THE DISCLOSED SUBJECT MATTER

The presently disclosed subject matter has been devised in view of the above and other characteristics, desires, and problems in the art, and to make certain changes to the existing light sources. An aspect of the disclosed subject matter includes providing vehicle lamps with a more favorable light distribution pattern than using a conventional LED light source.

According to another aspect of the disclosed subject matter, a light source device for vehicle lamps can include: a base board that has a plurality of chip mounting portions thereon that are located in a line and a plurality of electrodes thereon that are located adjacent the plurality of chip mounting portions in the direction of the line so as not to be disposed on a central portion of the line; a reflector that is formed as a cavity with a substantially rectangular opening by fixing on the base board so as to enclose and expose both the plurality of chip mounting portions and the plurality of electrodes, and so that a central portion of the cavity is located on the central portion of the line; a plurality of semiconductor light emitting chips mounted on the plurality of chip mounting portions, wherein adjacent semiconductor light emitting chips can be included on the central portion of the line, and at least one electrode thereof can be electrically connected to the plurality of electrodes; and an encapsulating resin disposed in the cavity. An interval between the adjacent semiconductor light emitting chips can be 50% less than the chip size.

In the above-described exemplary light source device, the light source device for vehicle lamps can also include: a base board including a plurality of chip mounting portions thereon that are located in a line so as to locate one chip mounting portion on a central portion of the line, and the base board providing a plurality of electrodes thereon that are located adjacent the plurality of chip mounting portions in the direction of the line; a reflector that includes a cavity with a substantially rectangular opening formed by being fixed on the base board so as to enclose and expose both the plurality of chip mounting portions and the plurality of electrodes, and so that a central portion of the cavity is located on the central portion of the line; a plurality of semiconductor light emitting chips mounted on the plurality of chip mounting portions, wherein one semiconductor light emitting chip is mounted on the one chip mounting portion on the central portion of the line, and at least one electrode thereof is electrically connected to the plurality of electrodes; and an encapsulating resin can be disposed in the cavity.

In the above-described exemplary light source, one angled inner surface located in a direction of a short side in the cavity can be smaller than other angled inner surfaces. The angled surface can be set at an angle within the range of 10° to 25°. The encapsulating resin can include at least one of a transparent resin and a mixture resin, the mixture resin including a resin mixed with at least one of a diffuser, a phosphor, and a pigment for selectively absorbing light having a predetermined wavelength. The plurality of semiconductor light emitting chips can be blue LED chips or ultraviolet LED chips or mixture chips that include a red LED chip, a green LED chip and a blue LED chip.

Another of the aspects of the disclosed subject matter includes a vehicle lamp that can include: the above-described light source device; a shield plate; and a projection lens. Furthermore, the vehicle lamp can include at least one reflector, wherein each first focus of the reflectors and each first focus of the light source device are located in close proximity or at the same location, and each first focus distance is within the range of 20 mm. A second focus of at least one reflector can be located near the shield plate.

BRIEF DESCRIPTION OF THE DRAWINGS

These and other characteristics and features of the disclosed subject matter will become clear from the following description with reference to the accompanying drawings, wherein:

FIGS. 11(A) and (B) are schematic top views showing exemplary locations using three LED chips for a light source made in accordance with principles of the disclosed subject matter;

FIGS. 12(A) and (B) are schematic top views showing further exemplary locations using five LED chips for a light source made in accordance with principles of the disclosed subject matter;

DETAILED DESCRIPTION OF EXEMPLARY EMBODIMENTS

Figure 1:
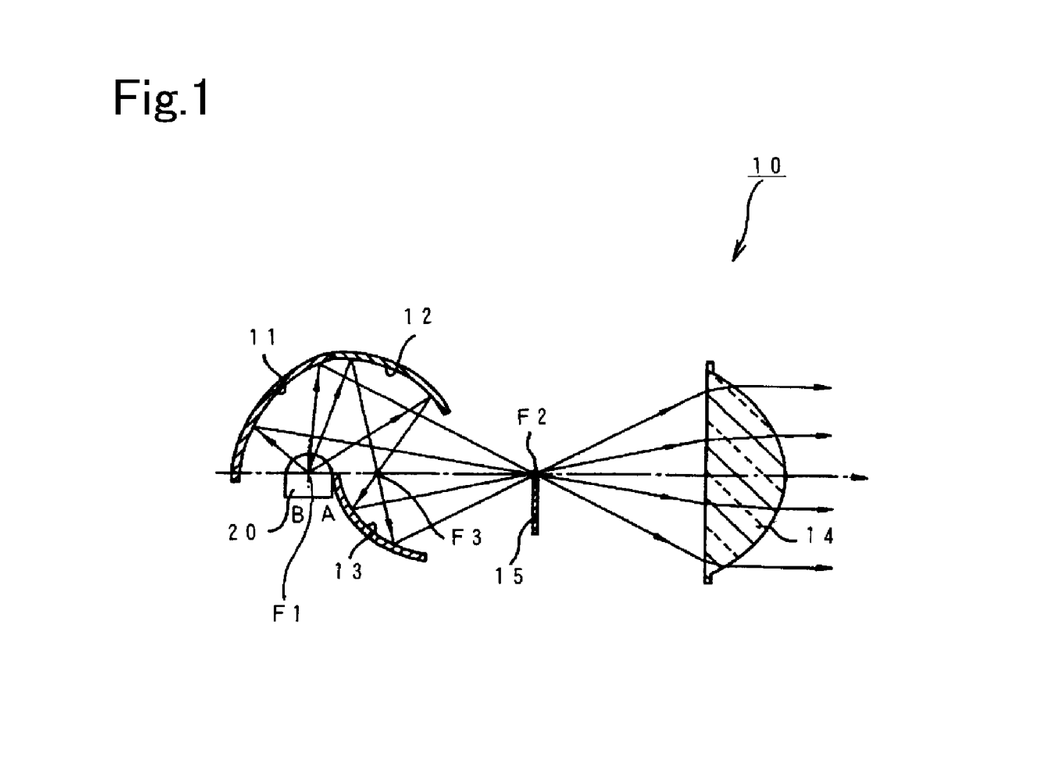
FIGS. 1 is a schematic cross-section view showing a structure for an exemplary embodiment of a vehicle headlight made in accordance with principles of the disclosed subject matter.

The disclosed subject matter will now be described in detail with reference to FIGS. 1 to 12. FIG. 1 is a schematic cross-section view showing a structure for an exemplary embodiment of a vehicle headlight made in accordance with principles of the disclosed subject matter. A vehicle headlight 10 shown in FIG. 1 is a projector-type headlight, which can include a light source 20, a first reflector 11, a second reflector 12, a third reflector 13, a projection lens 14, and a shield plate 15.

The first reflector 11 can have an elliptic surface that has a first focus F1 located near a central portion of the light source 20 so that a major axis thereof corresponds with a light axis in a direction towards light-emission for the light source 20. A second focus F2 can be located near a rearward focus of the projection lens 14. The first reflector can be configured to reflect light emitted from the light source 20 in a direction towards the projection lens 14. The second reflector 12 can be configured to include an elliptic surface that has a first focus F1 located near the central portion of the light source 20 and second focus F3 located at a more rearward position than the second focus F2 of the first reflector 11. The third reflector 13 can include a parabolic surface or an elliptic surface, and can have a first focus located near the second focus F3 of the second reflector 12, and a second focus can be located near the second focus F2 of the first reflector 11, that is to say, on the rearward focus of the projection lens 14. Surfaces that have focus distances with respect to the light source 20 within the range of 20 mm, can include the first reflector 11 and the second reflector 12 (among the above three reflectors). Their first focuses can be located near the central portion of the light source 20. In addition, the vehicle lamp can be configured with only a first reflector in the optical structure, and may not necessarily require the second reflector 12 and/or the third reflector 13. Furthermore, the vehicle lamp can be configured as a direct-projection-typed lamp that does not include the reflectors.

The projection lens 14 can be composed of a convex lens that has a focus located near or at the second focus F2 of both the first reflector 11 and the third reflector 13 so as to focus a light emitted from the light source 20 and/or lights reflected from the first reflector 11 and the third reflector 13. The shield plate 15 can be located near the focus of the projection lens 14 and in the way of light paths from the light source 20 to the projection lens 14 in order to form a cutoff line.

Figure 2:
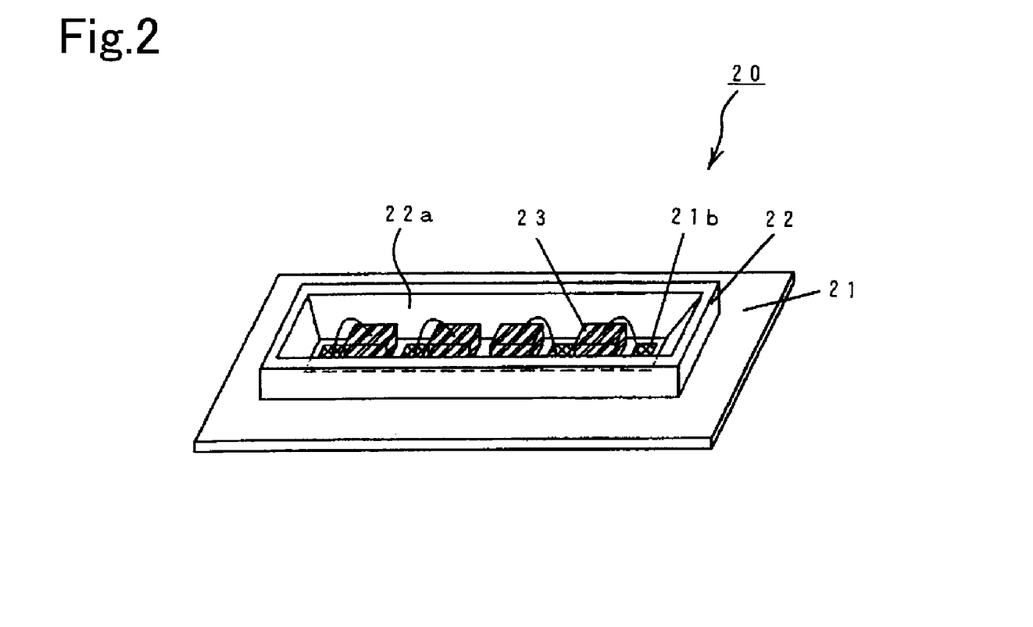
FIG. 2 is a schematic perspective view of the exemplary light source of the vehicle headlight shown in FIG. 1.
Figure 3:
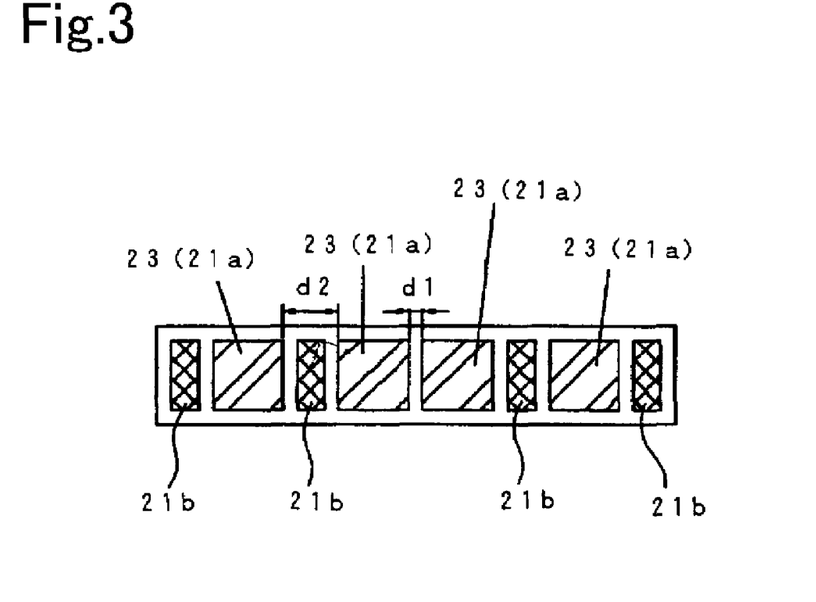
FIG. 3 is a schematic top view showing the bottom of the cavity of the light source shown in FIG. 2.
Figure 4:
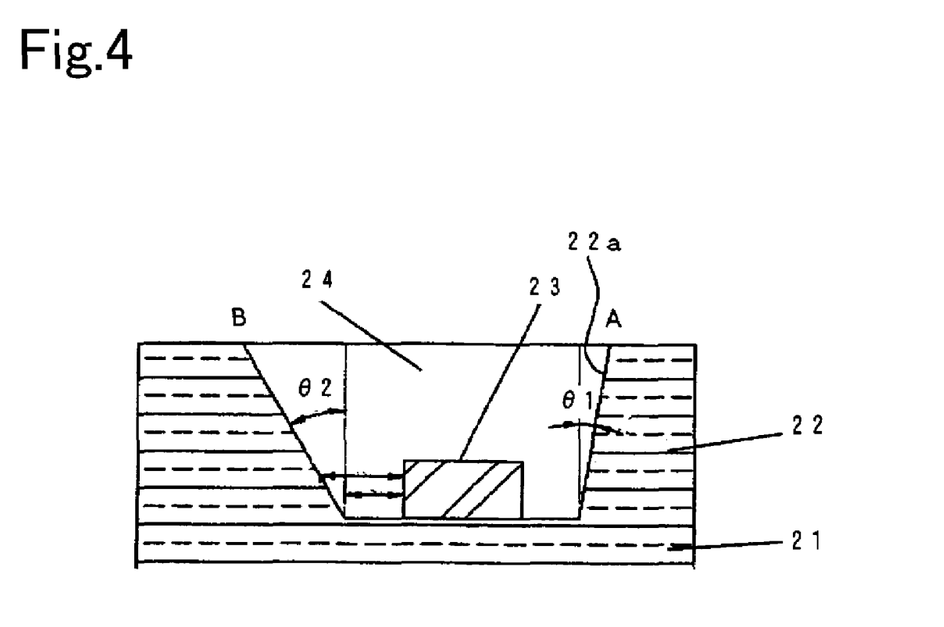
FIG. 4 is a side cross-section view taken in a direction into a short side of the light source shown in FIG. 2.

The light source 20 can be constructed, for example, as shown in FIG. 2 to FIG. 4. FIG. 2 is a schematic perspective view showing an exemplary light source for the vehicle headlight shown in FIG. 1. FIG. 3 is a schematic top view showing the cavity bottom for the light source shown in FIG. 2. FIG. 4 is a side cross-section view taken in a direction of a short side of the light source shown in FIG. 2.

The light source 20 can include: a base board 21 that includes a plurality of chip mounting portions 21a thereon which are located in a line. A plurality of electrodes 21b can be located adjacent the base board 21 and adjacent the plurality of chip mounting portions 21a and in the direction of a line. A reflector 22 can be formed with a cavity 22a and fixed on the base board 21 so as to enclose both the plurality of chip mounting portions 21a and the plurality of electrodes 21b. A plurality of LED chips 23 can be mounted on the plurality of chip mounting portions 21a that are exposed in the cavity 22a. An encapsulating resin 24 can be disposed in the reflector.

The base board 21 can be made from a high thermal conductive material such as a metal board, a ceramic substrate such as $Al_2O_3$, AlN, SiC, $Si_3N_4$, or $ZrO_2$, and the like. The board 21 can be formed with electrode conductor patterns on a surface thereof and the electrode conductor patterns can include the plurality of chip mounting portions 21a and the plurality of the electrodes 21b, which can be electrically connected to a circuit board by leading them on and/or under the base board 21.

The plurality of chip mounting portions 21a can be located in a line in order to form a slender or thin light source. The plurality of electrodes 21b can also be located in the direction of the line so as to be formed between each of chip mounting portions 21a or on either side of the chip mounting portions 21a as shown in FIG. 3. Thus, two chip mounting portions located at a central portion of the line can be located adjacent each other at very narrow intervals, respectively.

The reflector 22 can be composed of an opaque resin material, a metal material, a ceramic material, and the like, and can be fixed at a predetermined position on the base board 21 via a wax, an adhesive material with a high thermal conductivity, etc. The reflector 22 can include a cavity 22a that has a substantially rectangular and slender opening in order to expose both the plurality of chip mounting portions 21a and the plurality of electrodes 21b.

The cavity 22a can have sides that have a slant angle θ 1 (side A) and θ 2 (side B) in both directions on either side of a short side so as to expand upward as shown in FIG. 4. For example, θ 1 can be formed in a range of from about 10° to about 25° and θ 2 can be formed in a larger range of about 10° to about 90°. θ 1 may also be 0° and the plurality of LED chips 23 may approach being a perpendicular surface of the cavity 22a in order to focus a high brightness portion thereof and maintain a high density by the slender light source. However, θ 1 can be formed within the range of about 10° to about 25° in order to increase luminous flux. Because θ 2 can be larger than θ 1 in order to form a light distribution pattern, θ 2 can be formed within the range of about 10° to about 90°.

The vehicle lamp 10 shown in FIG. 1 can include the reflector 22, of which side A (θ 1) can be disposed in a direction toward the light-emitting (right side in FIG. 1) and side B (θ 2) can be disposed in a direction away from the light-reflecting (left side in FIG. 1). The plurality of LED chips 23 can be disposed at a predetermined interval against inner surfaces of the cavity 22a so as not to permit return of the light emitted from the plurality of LED chips 23 therein and reflection on the inner surfaces, which can result in absorption of the light in the cavity 22a when reflected on the inner surfaces of the cavity 22 many times.

The reflector 22 can be composed of an integral one piece casing with the base board 21. In this case, both the plurality of chip mounting portions 21a and the plurality of electrodes 21b can be formed by lead frames, which can be insert-formed in the casing. The casing can also include a base board 21 that is provided with a reflector 22 that is made by a high thermal conductive semiconductor substrate such as a silicon. The plurality of chip mounting portions 21a and the plurality of electrodes 21b can also be formed on such a base board 21.

The plurality of LED chips 23 can be, for example, blue LED chips that can be electrically connected and mounted on the plurality of chip mounting portions 21a via a solder, an Ag-paste, and the like. Electrodes on top surfaces of the chips 23 can be electrically connected to the adjacent plurality of electrodes 21b via bonding wires. An interval d1 between two LED chips located on the central portion among the plurality of chip mounting portions 21a can be formed within the range of 50% of the chip size, for example 15%, in order to maintain higher brightness than the other LED chips among the plurality of LED chips 23, as shown in FIG. 3.

Even if an interval d2 between two LED chips having an electrode 21b between them is formed without the range of 50% of the chip size, a light distribution pattern for a vehicle lamp can be formed. However, if the interval d2 is formed at a long interval, a uniformity of the light distribution pattern may not be able to be maintained. Thus, when the chip size is 1 mm square, the intervals d1, d2 may be 0.15 mm, 0.5 mm, respectively.

The encapsulating resin 24 can be composed of at least one of a transparent resin and a mixture resin, and the mixture resin can include a resin mixed with at least one of a diffuser, a phosphor, and a pigment for selectively absorbing light having a predetermined wavelength. The encapsulating resin 24 can be filled in the cavity 22a by a dispenser or the like, and can be disposed or set by means of a thermal solidification. When the plurality of LED chips 23 are blue LED chips, the blue LED chips can emit light of approximately white color tone through the encapsulating resin 24, which can include the mixture resin for converting light from blue to yellow light that is a complementary color of the originally emitted blue light. The plurality of LED chips can also be ultraviolet LED chips, and can include mixture chips that include a red LED chip, a green LED chip and a blue LED chip, by arranging the appropriate mixture resin(s).

The vehicle lamp 10 can be configured as described above, and can operate as follows. When the plurality of LED chips 23 are blue LED chips, the blue LED chips (23) of the light source 20 can emit via the plurality of chip mounting portions 21a and the plurality of electrodes 21b by supplying a voltage source thereto. The light emitted from the blue LED chips (23) can emit from a surface of the encapsulating resin 24 after being transmitted through the resin 24.

A part of the light emitted from the blue LED chips (23) into the encapsulating resin 24 can be emitted as the original blue light and another part of the light can be converted to yellow light through the encapsulating resin 24, which is mixed with the mixture resin for converting blue light to yellow light. Because the yellow light can be mixed with the part of the blue light emitted from the blue LED chips (23) by means of additive color mixture, the light source 20 can emit light of approximately white color tone through the encapsulating resin 24.

Figure 5:
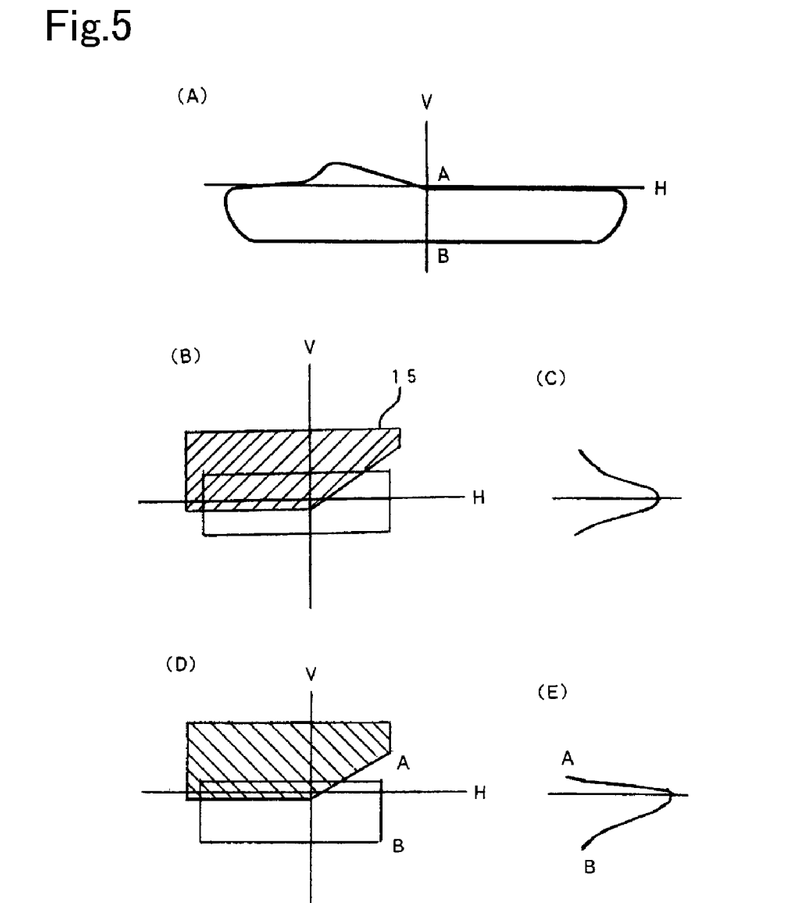
FIG. 5(A) is a light distribution pattern in accordance with the vehicle lamp shown in FIG. 1.
FIG. 5(B) is a relation with between a shield plate and a light pattern projected by a conventional LED light source.
FIG. 5(C) is a brightness distribution in a direction of line V in the conventional LED light source light pattern shown in FIG. 5(B)
FIG. 5(D) is a relation between a shield plate and a light pattern projected by an embodiment of an LED light source made in accordance with the disclosed subject matter.
FIG. 5(E) is a brightness distribution in a direction of line V for the LED light source of FIG. 5(D)

The above white light emitted from the light source 20 can be emitted forward via the projection lens 14 as shown in FIG. 1 by reflecting a part of the light on the first reflector 11 and reflecting another part of the light on both the second reflector 12 and the third reflector 13. The above-described light can form a light distribution pattern for a low beam, as shown in FIG. 5(A), through the shield pate 15, which can shield a part of the light.

Figure 6:
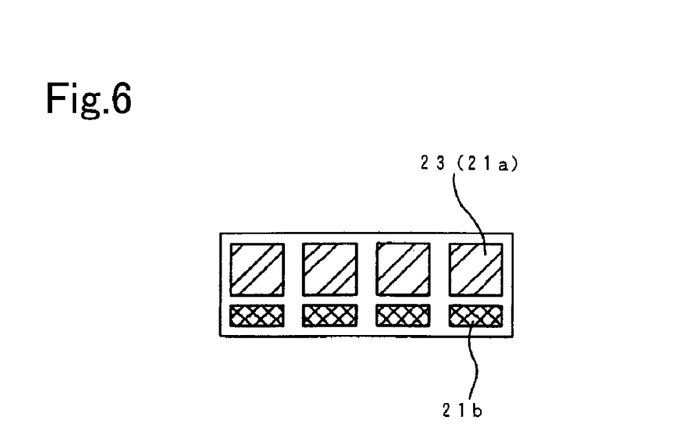
FIG. 6 is a schematic top view showing an exemplary location of both the LED chips and electrodes for a light source made in accordance with principles of the disclosed subject matter.

As described above, because the plurality of LED chips 23 can be located in a line and the plurality of electrodes 21b can also be located in a direction of the line, the light emitted from the plurality of LED chips 23 can form a slender-shaped light distribution. If the plurality of electrodes 21b is located in a direction of a short side as shown in FIG. 6, the light can not be formed in as slender of a shape as that formed by the light source shown in FIG. 3 because the opening of the cavity 22a become wide in the short side and narrow in a long side (in a direction of the line).

Furthermore, because the slant angle θ 1 of side A can be smaller than the slant angle θ 2 of side B, the light source 20 can include such a bright characteristics that the brightness gradually decreases from side A to side B. Thus, because it is possible to light a far side of a road by a high bright part of the light source 20 and to light a near side of a road by a low bright part of the light source 20 in an optical configuration that includes reflectors 11, 12, 13 and the projection lens 14, the light source 20 can be more favorable for a vehicle lamp. The electrode (21b) between the two LED chips (23) located on the central portion in the cavity 22a does not exist in this embodiment, and the above two LED chips (23) can be closely located and can form the brightest part in the light source 20. Thus, because a central portion (a cross portion of lines V, H shown in FIG. 5(A)) of a light distribution pattern that is emitted forward can be lit with high brightness qualities in it, a visibility quality with respect to a far side of a road can be more favorable so as not to require extremely high lighting of a near side of the road.

As described above, the light source 20 can include a light-emitting surface thereof that can provide for control of a brightness distribution by a shape of the cavity 22a, and can assist the light distribution pattern that can be formed by the above-described optical configuration. Thus, even if a reflector has a focus that is located within the range of 20 mm from the light source 20, the light distribution pattern can be formed with more favorable qualities than that of a conventional vehicle lamp.

The light distribution pattern for a low beam shown in FIG. 5(A) may be formed by shielding the light emitted from the light source 20 via the shield plate 15, which may shield the hatched portion shown in FIG. 5(B) and FIG. 5(D). In a conventional LED light source, a central portion in a brightness distribution of line V may be the portion with the highest brightness qualities, as shown in FIG. 5(C). Thus, because the light emitted from the light source 20 may be shielded near a central portion thereof by the shield plate 15 as shown in FIG. 5(B), the light emitted forward via the optical lens 14 may decrease by approximately half thereof. However, in light source 20, the portion with the highest brightness quality can be formed at a lower portion as compared to the central portion along a brightness distribution of line V as shown in FIG. 5(E) by forming the cavity 22a with a smaller slant angle θ 1 of side A than the slant angle θ 2 of side B. Thus, even if the light emitted from the light source 20 is shielded near a central portion thereof by the shield plate 15, the light emitted forward via the optical lens 14 may not decrease as in a conventional LED light source.

Figure 7:
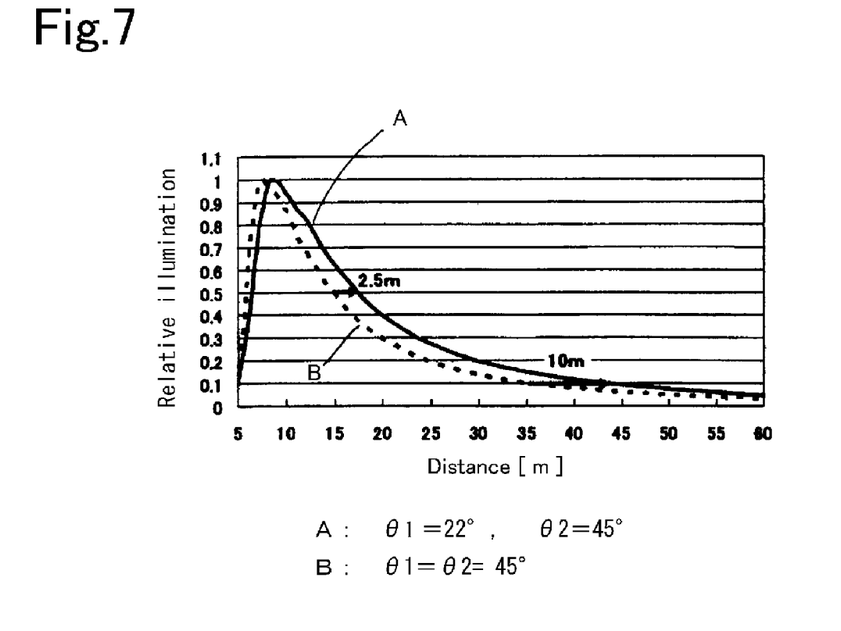
FIG. 7 is a relative illumination characteristic formed by a computer simulation in accordance with the vehicle lamp shown in FIG. 1.

Relative illumination characteristics of the vehicle lamps in accordance with the disclosed subject matter will now be given with reference to computer simulation data. FIG. 7 shows a relative illumination characteristic in relation to a distance according to the vehicle lamp 10 shown in FIG. 1, wherein solid line A refers to a case in which the slant angle θ 1 is 22° and θ 2 is 45°, and dotted line B refers to a case in which the slant angles θ 1 and θ 2 are the same, e.g., 45°. FIG. 7 shows that the light source referenced by solid line A can light a target located 2.5 m further when at a relative illumination of 0.5 than a light source referenced by dotted line B, and can light a target located 10 m further when at a relative illumination of 0.1 than a light source referenced by dotted line B.

Figure 8:
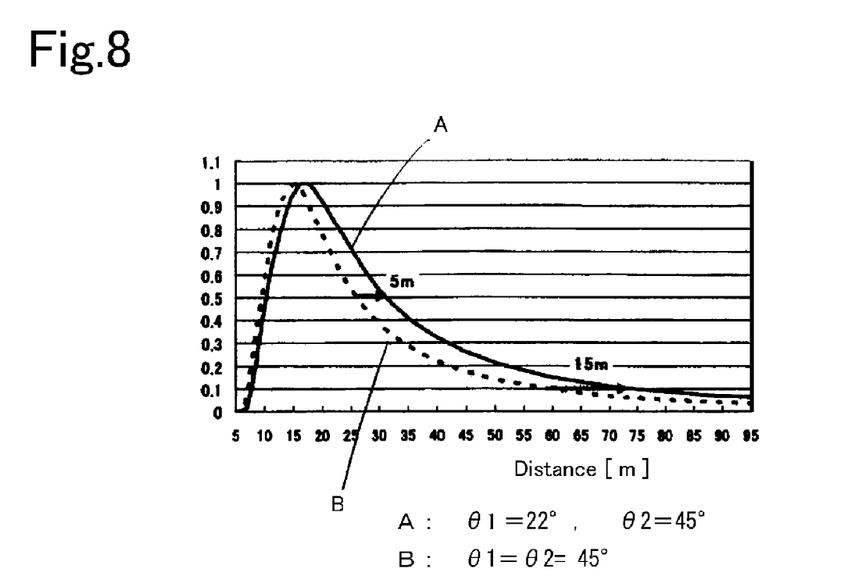
FIG. 8 is a relative illumination characteristic formed by a computer simulation according to a direct-projection typed vehicle lamp.

FIG. 8 depicts a relative illumination characteristic in relation to a distance according to a direct-projection-type vehicle lamp without reflectors, wherein solid line A refers to a case in which the slant angle θ1 is 22° and θ2 is 45°, and dotted line B refers to a case in which the slant angles θ1 and θ2 are the same 45°. FIG. 8 shows that a light source referenced by solid line A can provide light at a distance 5 m further at a relative illumination 0.5 than a light source referenced by dotted line B, and can provide light at a distance 15 m further at relative illumination 0.1 than a light source referenced by dotted line B.

Thus, the above-described vehicle lamps and light sources can light a farther side of a road with more brightness. Furthermore, because the illumination can gently decrease from the highest illumination portion, at which distance is in the range of 5 m to 15 m, the disclosed subject matter can provide a vehicle lamp with more favorable characteristics.

Figure 9:
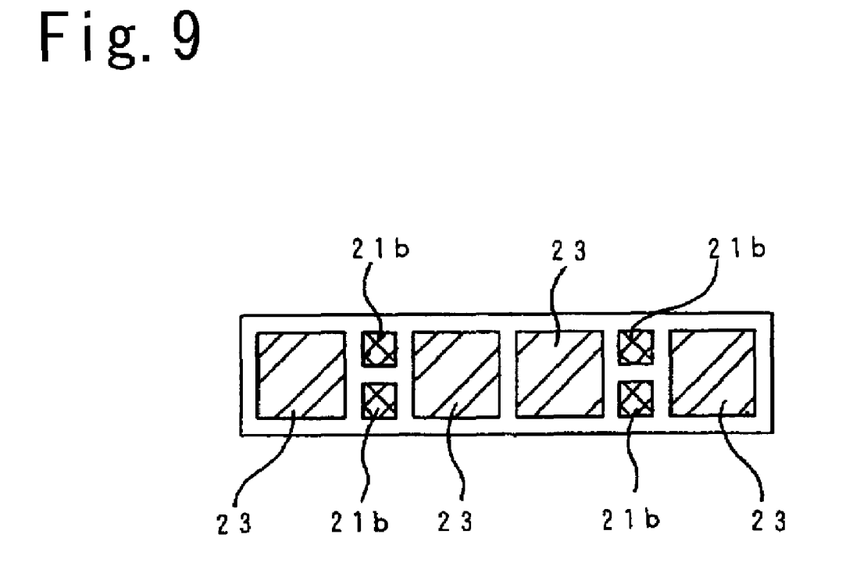
FIG. 9 is a schematic top view showing exemplary locations of both the LED chips and electrodes for a light source made in accordance with principles of the disclosed subject matter.

The above-described light source 20 can include four LED chips 23 mounted on four chip mounting portions 21*a* located in a line and each of four electrodes 21*b* can be located outside each of the four LED chips 23. However, each of the four electrodes 21*b* can alternatively be located between each of the four LED chips 23 as show in FIG. 9. In the case, a width of the reflector 22 can be narrower than that shown in FIG. 3, and the optical characteristics can be basically the same as those of the light source 20 shown in FIG. 2.

Figure 10:
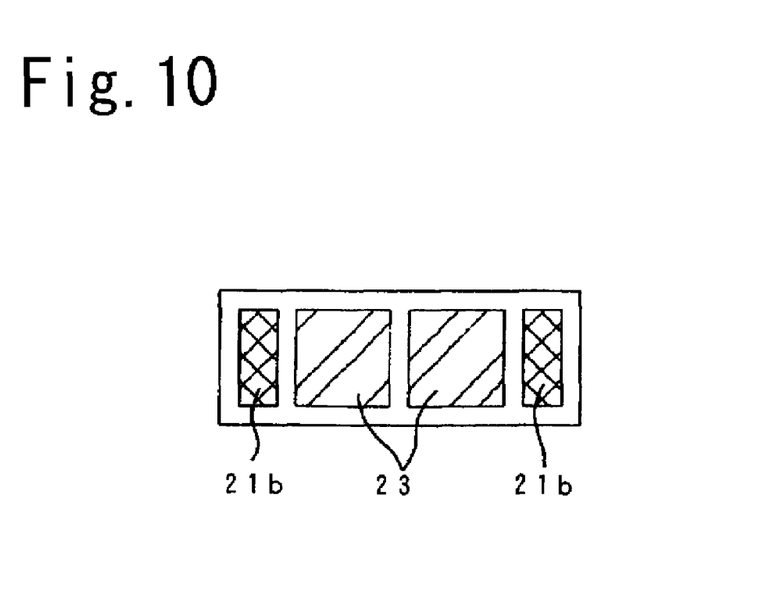
FIG. 10 is a schematic top view showing other exemplary locations using two LED chips for a light source made in accordance with principles of the disclosed subject matter.

Although four LED chips 23 are described above with reference to the plurality of the LED chips 23, four LED chips 23 can not necessary, and other amounts and combinations and arrangements of the LEDs chips are contemplated that would fall within the scope of the disclosed subject matter. For example, two LED chips 23 can be configured as shown in FIG. 10 and other numbers of LED chips 23 can be also configured similarly. For example, a single LED chip can be also configured in the cavity 22*a*.

Figure 11:
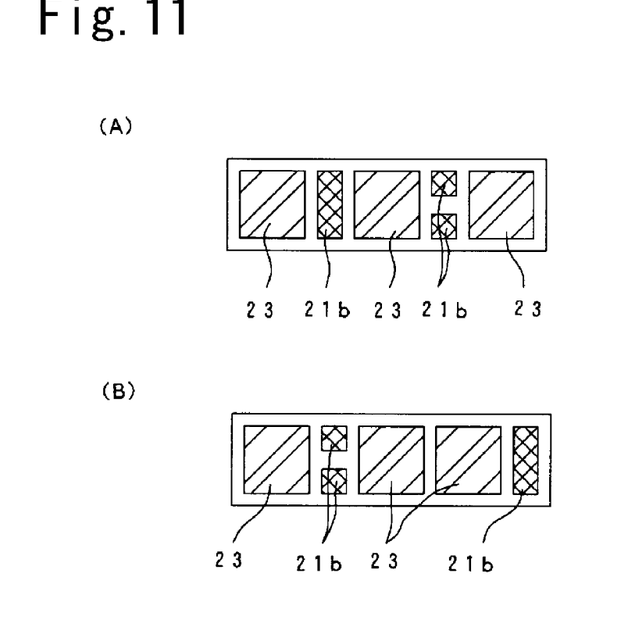
Figure 12:
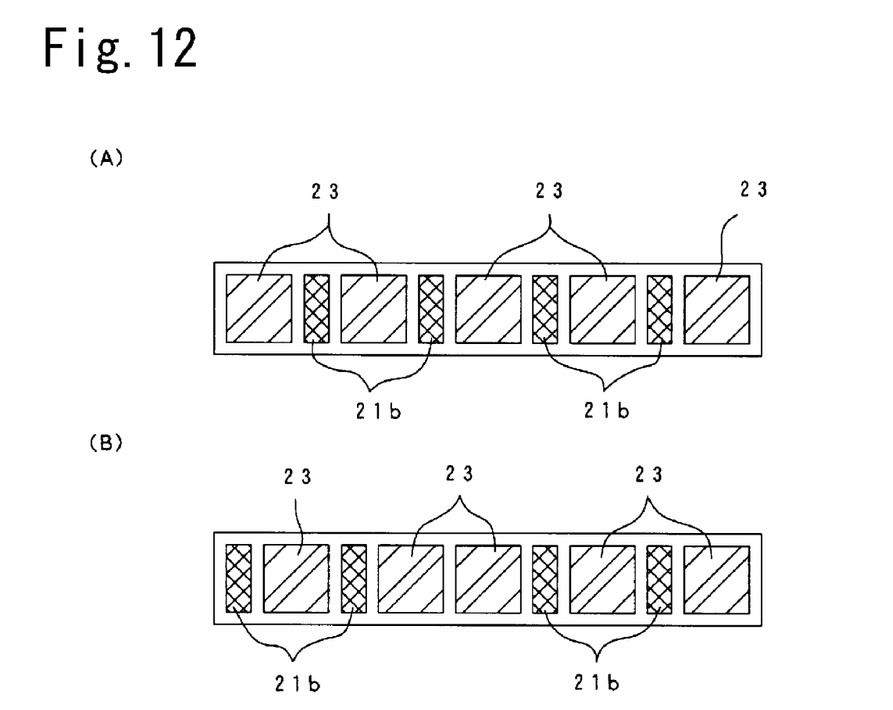

The single LED chip 23 can be configured by mounting an LED chip 23 on the central portion and among a plurality of chip mounting portions 21*a* as shown in FIG. 11. In addition, five LED chips 23 can be provided as shown in FIG. 12(A) and FIG. 12(B).

The greater the number of LED chips 23, the more ability there is to form the light source with more slenderness and brightness. With reference to the number of LED chips mounted on the central portion, two LED chips 23 can be formed such that they are brighter than a single LED chip. The number of the above-described LED chips 23 can be determined according to the kind of vehicle lamp and the particular optical construction, including the overall design requirements for a vehicle and for the lamps.

Thus, the disclosed subject matter can provide a light source with a high luminous flux and a favorable bright distribution, and can include vehicle lamps with a favorable brightness distribution. In addition, the vehicle lamps can also be miniaturized by the LED light source described above when used as the light source. Various modification of the above disclosed embodiments can be made without departing from the spirit and scope of the presently disclosed subject matter.

While there has been described what are at present considered to be exemplary embodiments of the invention, it will be understood that various modifications may be made thereto, and it is intended that the appended claims cover such modifications as fall within the true spirit and scope of the invention. All conventional art references described above are herein incorporated in their entirety by reference.

What is claimed is:

1. A light source device for a vehicle lamp, comprising:

a base board;

a plurality of chip mounting portions located adjacent the base board and configured in a line, the line extending in a first direction and having a central divider axis that is perpendicular to the first direction and divides the line into substantially equal halves;

a plurality of electrodes located adjacent the plurality of chip mounting portions and extending along the first direction of the line and spaced from the central divider axis;

a reflector located adjacent the base board and configured to form a cavity with a substantially rectangular opening that encloses and exposes both the plurality of chip mounting portions and the plurality of electrodes, wherein a central portion of the cavity is located at the central divider axis;

a plurality of semiconductor light emitting chips mounted on the plurality of chip mounting portions, wherein an adjacent pair of the semiconductor light emitting chips are located at the central divider axis, and at least one electrode of the adjacent semiconductor light emitting chips is electrically connected to at least one of the plurality of electrodes; and an encapsulating resin disposed in the cavity.

2. The light source device for a vehicle lamp according to claim 1, wherein a distance between the adjacent pair of the semiconductor light emitting chips is at least 50% less than a width extending in the first direction of one of the light emitting chips.

3. The light source device for a vehicle lamp according to claim 2, wherein the reflector includes a first side extending substantially parallel with the first direction and a second side extending substantially parallel with the first direction, and the first side extends away from and at a first angle with respect to the base board, and the second side extends away from and at a second angle with respect to the base board that is different from the first angle.

4. The light source device for a vehicle lamp according to claim 3, wherein the first angle is within the range of 10° to 25°.

5. The light source device for a vehicle lamp according to claim 4, wherein the encapsulating resin includes at least one of a transparent resin and a mixture resin, the mixture resin including a resin mixed with at least one of a diffuser, a phosphor, and a pigment for selectively absorbing light having a predetermined wavelength.

6. The light source device for a vehicle lamp according to claim 5, wherein the plurality of semiconductor light emitting chips includes at least one of blue LED chips, ultraviolet LED chips, and mixture chips, the mixture chips including a red LED chip, a green LED chip and a blue LED chip.

7. The light source device for a vehicle lamp according to claim 3, wherein the encapsulating resin includes at least one of a transparent resin and a mixture resin, the mixture resin including a resin mixed with at least one of a diffuser, a phosphor, and a pigment for selectively absorbing light having a predetermined wavelength.

8. The light source device for a vehicle lamp according to claim 7, wherein the plurality of semiconductor light emitting chips includes at least one of blue LED chips, ultraviolet LED chips, and mixture chips, the mixture chips including a red LED chip, a green LED chip and a blue LED chip.

9. A vehicle lamp including the light source device according to claim 8, comprising:
a shield plate; and
a projection lens.

10. A vehicle lamp including the light source device according to claim 7, comprising:
a shield plate; and
a projection lens.

11. The light source device for a vehicle lamp according to claim 2, wherein the encapsulating resin includes at least one of a transparent resin and a mixture resin, the mixture resin including a resin mixed with at least one of a diffuser, a phosphor, and a pigment for selectively absorbing light having a predetermined wavelength.

12. The light source device for a vehicle lamp according to claim 11, wherein the plurality of semiconductor light emitting chips includes at least one of blue LED chips, ultraviolet LED chips, and mixture chips, the mixture chips including a red LED chip, a green LED chip and a blue LED chip.

13. The light source device for a vehicle lamp according to claim 1, wherein the reflector includes a first side extending substantially parallel with the first direction and a second side extending substantially parallel with the first direction, and the first side extends away from and at a first angle with respect to the base board, and the second side extends away from and at a second angle with respect to the base board that is different from the first angle.

14. The light source device for a vehicle lamp according to claim 13, wherein the first angle is within the range of 10° to 25°.

15. The light source device for a vehicle lamp according to claim 14, wherein the encapsulating resin includes at least one of a transparent resin and a mixture resin, the mixture resin including a resin mixed with at least one of a diffuser, a phosphor, and a pigment for selectively absorbing light having a predetermined wavelength.

16. The light source device for a vehicle lamp according to claim 15, wherein the plurality of semiconductor light emitting chips includes at least one of blue LED chips, ultraviolet LED chips, and mixture chips, the mixture chips including a red LED chip, a green LED chip and a blue LED chip.

17. A vehicle lamp including the light source device according to claim 14, comprising:
a shield plate; and
a projection lens.

18. The vehicle lamp according to claim 17, further comprising:
at least one reflector, wherein a first focus of the at least one reflector and a first focus of the light source device are substantially coincident, and each of the first focus of the light source device and first focus of the at least one reflector is located within a range of 20 mm from the light source device, and a second focus of the at least one reflector is located substantially at the shield plate.

19. The light source device for a vehicle lamp according to claim 13, wherein the encapsulating resin includes at least one of a transparent resin and a mixture resin, the mixture resin including a resin mixed with at least one of a diffuser, a phosphor, and a pigment for selectively absorbing light having a predetermined wavelength.

20. The light source device for a vehicle lamp according to claim 19, wherein the plurality of semiconductor light emitting chips includes at least one of blue LED chips, ultraviolet LED chips, and mixture chips, the mixture chips including a red LED chip, a green LED chip and a blue LED chip.

21. The light source device for a vehicle lamp according to claim 1, wherein the encapsulating resin includes at least one of a transparent resin and a mixture resin, the mixture resin including a resin mixed with at least one of a diffuser, a phosphor, and a pigment for selectively absorbing light having a predetermined wavelength.

22. The light source device for a vehicle lamp according to claim 21, wherein the plurality of semiconductor light emitting chips includes at least one of blue LED chips, ultraviolet LED chips, and mixture chips, the mixture chips including a red LED chip, a green LED chip and a blue LED chip.

23. A vehicle lamp including the light source device according to claim 1, comprising:
a shield plate; and
a projection lens.

24. A light source device for a vehicle lamp, comprising:
a base board;
a plurality of chip mounting portions located adjacent the base board and configured in a line, the line extending in a first direction and having a central divider axis that is perpendicular to the first direction and divides the line into substantially equal halves, at least one of the chip mounting portions intersecting with the central divider axis;
a plurality of electrodes located adjacent the plurality of chip mounting portions and extending along the first direction of the line;
a reflector located adjacent the base board and configured to form a cavity with a substantially rectangular opening that encloses and exposes both the plurality of chip mounting portions and the plurality of electrodes, wherein a central portion of the cavity is located at the central divider axis;
a plurality of semiconductor light emitting chips mounted on the plurality of chip mounting portions, wherein at least one of the semiconductor light emitting chips is mounted on the at least one of the chip mounting portions intersecting with the central divider axis, and at least one electrode of the at least one of the semiconductor light emitting chips is electrically connected to at least one of the plurality of electrodes; and
an encapsulating resin disposed in the cavity.

25. The light source device for a vehicle lamp according to claim 24, wherein the reflector includes a first side extending substantially parallel with the first direction and a second side extending substantially parallel with the first direction, and the first side extends away from and at a first angle with respect to the base board, and the second side extends away from and at a second angle with respect to the base board that is different from the first angle.

26. The light source device for a vehicle lamp according to claim 25, wherein the first angle is within the range of 10° to 25°.

27. The light source device for a vehicle lamp according to claim 26, wherein the encapsulating resin includes at least one of a transparent resin and a mixture resin, the mixture resin including a resin mixed with at least one of a diffuser, a phosphor, and a pigment for selectively absorbing light having a predetermined wavelength.

28. The light source device for a vehicle lamp according to claim 27, wherein the plurality of semiconductor light emitting chips includes at least one of blue LED chips, ultraviolet LED chips, and mixture chips, the mixture chips including a red LED chip, a green LED chip and a blue LED chip.

29. The light source device for a vehicle lamp according to claim 25, wherein the encapsulating resin includes at least one of a transparent resin and a mixture resin, the mixture resin including a resin mixed with at least one of a diffuser, a phosphor, and a pigment for selectively absorbing light having a predetermined wavelength.

30. The light source device for a vehicle lamp according to claim 29, wherein the plurality of semiconductor light emitting chips includes at least one of blue LED chips, ultraviolet LED chips, and mixture chips, the mixture chips including a red LED chip, a green LED chip and a blue LED chip.

31. The light source device for a vehicle lamp according to claim 24, wherein the encapsulating resin includes at least one of a transparent resin and a mixture resin, the mixture resin including a resin mixed with at least one of a diffuser, a phosphor, and a pigment for selectively absorbing light having a predetermined wavelength.

32. The light source device for a vehicle lamp according to claim 31, wherein the plurality of semiconductor light emitting chips includes at least one of blue LED chips, ultraviolet LED chips, and mixture chips, the mixture chips including a red LED chip, a green LED chip and a blue LED chip.

33. A vehicle lamp including the light source device according to claim 24, comprising:

a shield plate; and a projection lens.

* * * * *